(12) United States Patent
Tanaka et al.

(10) Patent No.: US 6,376,157 B1
(45) Date of Patent: Apr. 23, 2002

(54) METHOD OF MANUFACTURING A SEMICONDUCTOR DEVICE, CHEMICAL SOLUTION TO FORM FINE PATTERN, AND SEMICONDUCTOR DEVICE

(75) Inventors: Mikihiro Tanaka; Takeo Ishibashi, both of Tokyo (JP)

(73) Assignees: Mitsubishi Denki Kabushiki Kaisha, Tokyo; Ryoden Semiconductor System Engineering Corporation, Hyogo, both of (JP)

(*) Notice: Subject to any disclaimer, the term of this patent is extended or adjusted under 35 U.S.C. 154(b) by 0 days.

(21) Appl. No.: 09/539,862

(22) Filed: Mar. 31, 2000

(30) Foreign Application Priority Data

Sep. 27, 1999 (JP) .............................. 11-273125

(51) Int. Cl.$^7$ ................................. G03F 7/40
(52) U.S. Cl. .................. 430/314; 430/323; 430/328
(58) Field of Search ................... 430/314, 323, 430/328

(56) References Cited

FOREIGN PATENT DOCUMENTS

JP 10-73927 3/1998

*Primary Examiner*—Cynthia Hamilton
(74) *Attorney, Agent, or Firm*—McDermott, Will & Emery

(57) ABSTRACT

In a method of manufacturing a semiconductor device, a first resist pattern, which evolves an acid, is formed on a semiconductor substrate. The first resist pattern is treated with a chemical solution containing a crosslinking agent and a swelling promoter. The crosslinking agent is capable to bring about crosslinking in the presence of an acid at the surface layer of the first resist pattern. The crosslinking agent and swelling promoter in the chemical solution permeate into the surface layer of the first resist pattern, thereby swells the surface layer. The chemical solution is removed from the surface of the first resist pattern. The first resist pattern is caused to evolve an acid, by which a crosslinked film is formed in the swollen surface layer of the first resist pattern. Thus, a second resist pattern is formed, and the semiconductor substrate is etched through the second resist pattern as a mask. The resist pattern thus obtained has a fine feature which exceeds the limit of the wavelength of light for exposure.

4 Claims, 3 Drawing Sheets urea melamine glycoluril alkoxymethyleneurea benzoguanamine alkoxymethylmelamine $R_3 = H, OCH_3$
N-alkoxymethyleneurea ethyleneurea ethyleneureacarboxylic acid

METHOD OF MANUFACTURING A SEMICONDUCTOR DEVICE, CHEMICAL SOLUTION TO FORM FINE PATTERN, AND SEMICONDUCTOR DEVICE

BACKGROUND OF THE INVENTION

1. Field of the Invention

The present invention relates to a material to reduce line spaces and hole diameters in resist patterns, a method of forming finely separated patterns with the aid of the material, a method of producing semiconductor devices with the finely separated patterns, and a semiconductor device produced by the method.

2. Background Art

The increasing degree of integration for semiconductor devices needs lines and separations much more fine than before in their manufacturing method. Fine patterns in semiconductor devices are usually formed by resist patterning (photolithography) and ensuring etching on underlying thin layers through the patterned resist as a mask. Therefore, photolithography plays an important role in fine patterning. It consists of steps of resist coating, mask alignment, exposure, and development. The disadvantage of photolithography is that the extent of fineness is limited by the wavelength of light used for exposure. Moreover, in conventional photolithography, it is difficult to control the etching resistance of the resist and hence it is difficult to obtain a desired surface state (such as the surface roughness of the pattern side wall) after etching by controlling the etching resistance.

As mentioned above, the resist pattern formed by photolithography (consisting of resist coating, exposure, and development) has been used as such for the fine patterning of semiconductor devices. The patterns formed in this way are limited in fineness according to the resist performance, the wavelength of light for exposure, and the condition of illumination for exposure. There has been no idea of "thickening" the patterns, thereby making line spaces smaller. Thus, the originally formed resist pattern determines the fineness of the pattern formed on the semiconductor substrate.

In order to solve the above-mentioned problems involved in the prior art technology, the present inventors previously developed a new technology as disclosed in Japanese Patent Laid-open No. Hei 10-73927.

According to this disclosed technology, a first resist pattern is formed by the conventional method. Then, this resist pattern is coated with another resist, which is subsequently crosslinked and developed so as to give a crosslinked film. This crosslinked film sticks to the surface of the first resist pattern, thereby reducing the space between patterned lines and the size of patterned hole opening. In this way it is possible to form the fine patterns which cannot be obtained by using the first resist pattern alone.

SUMMARY OF THE INVENTION

The present invention is intended to improve the present inventors' previous technology mentioned above. Therefore, it is an object of the present invention to provide an improved method of forming fine patterns and an improved method of producing semiconductor devices, in which, even when used in a method in which high step differences are produced like isolated residual patterns, a resist is formed so as not to be unevenly coated due to the isolated pattern, and a resist is formed not to cause insufficient thickened pattern and pattern defects.

According to one aspect of the present invention, in a method of manufacturing a semiconductor device, a first resist pattern, which evolves an acid, is formed on a semiconductor substrate. The first resist pattern is treated with a chemical solution containing a crosslinking agent and a swelling promoter, and the crosslinking agent brings about crosslinking in the presence of an acid in the surface layer of the first resist pattern. The crosslinking agent and swelling promoter in the chemical solution is caused to permeate into the surface layer of the first resist pattern, thereby the surface layer is swelled. The chemical solution is removed from the surface of the first resist pattern. The first resist pattern is caused to evolve an acid, and a crosslinked film is formed in the swollen surface layer of the first resist pattern, thereby a second resist pattern is formed. Further, the semiconductor substrate is etched through the second resist pattern as a mask.

In another aspect of the present invention, a chemical solution, for forming a fine pattern, is provided which comprises a solvent, a crosslinking agent, and a swelling promoter. The chemical solution causes the crosslinking agent and swelling promoter to permeate into a resist film, and the crosslinking agent brings about crosslinking in the resist film in the presence of an acid.

Other and further objects, features and advantages of the invention will appear more fully from the following description.

BRIEF DESCRIPTION OF THE DRAWINGS

FIG. 1(a) is a mask pattern 100 of fine holes.

FIG. 1(b) is a mask pattern 200 of fine spaces.

FIG. 1(c) is an island pattern 300.

DETAILED DESCRIPTION OF THE PREFERRED EMBODIMENTS

The present invention will be described in more detail with reference to the accompanying drawings.

First Embodiment

Figure 1A:
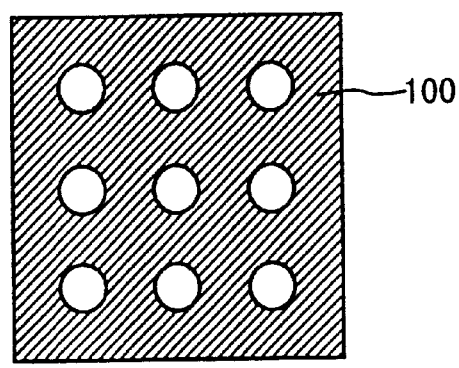
FIGS. 1(a) to 1(c) are, respectively, a view showing a mask pattern used to form a finely isolated resist pattern, to which the invention is directed.
Figure 1B:
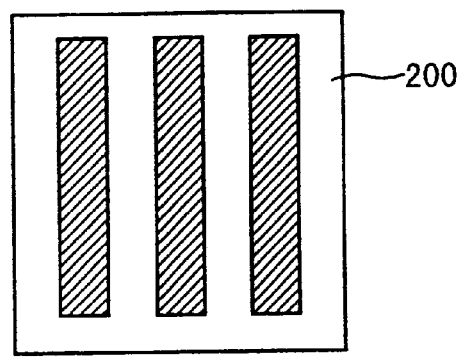
Figure 1C:
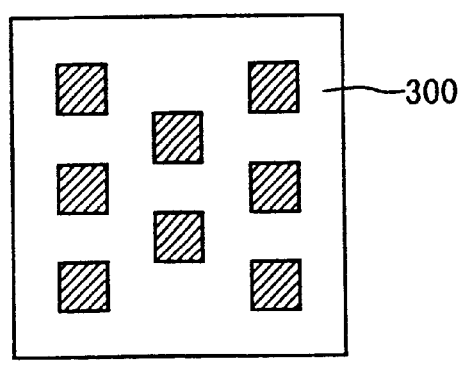

FIG. 1(a) through FIG. 1(c) show mask patterns respectively to form finely separated resist patterns according to the present invention. FIG.1(a) shows a mask pattern 100 for fine holes. FIG. 1(b) shows a mask pattern 200 for fine lines. FIG. 1(c) shows a mask pattern 300 for islands.

FIG. 2(a) through FIG. 2(f) show the steps of forming a fine resist pattern and a semiconductor device in a first embodiment of the present invention.

Figure 3:
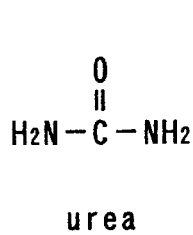
FIG. 3 show chemical structural formulas of crosslinking agents in a chemical solution used to form a fine pattern according to the present invention.
Figure 3:
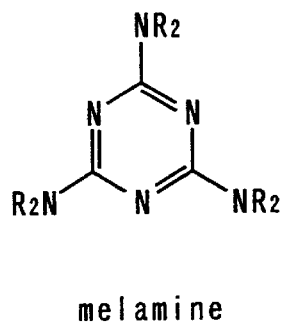
Figure 3:
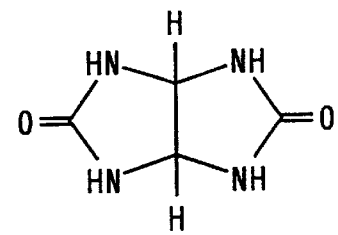
Figure 3:
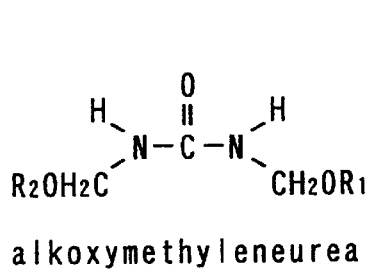
Figure 3:
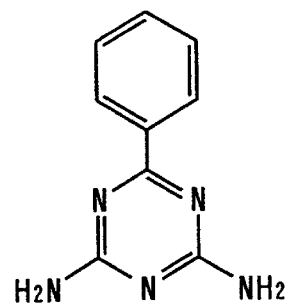
Figure 3:
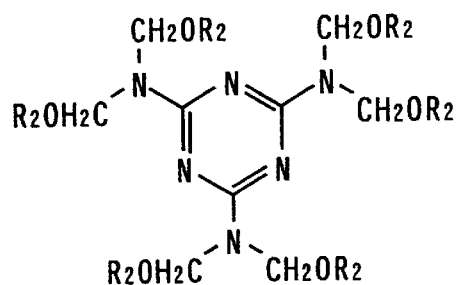
Figure 3:
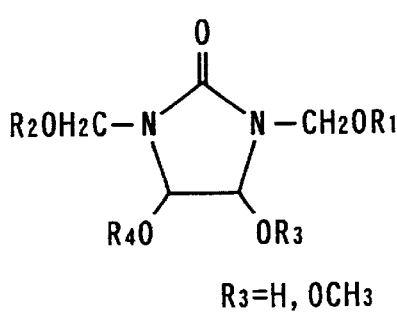
Figure 3:
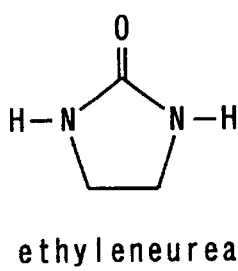
Figure 3:
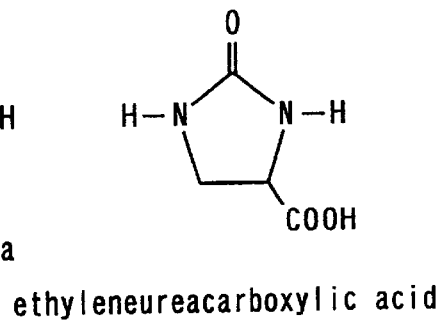

FIG. 3 shows structural formulas of crosslinking agents in a chemical solution used to form a fine pattern according to the present invention.

Referring now to FIGS. 1(a) to 1(c) and FIGS. 2(a) to 2(f), a method for forming a finely isolated resist pattern and a method of manufacturing a semiconductor device are described.

Figure 2A:
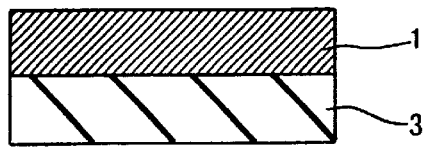
FIGS. 2(a) to 2(f) show a process flow illustrating a method of forming a finely isolated resist pattern according to the present invention.
Figure 2B:
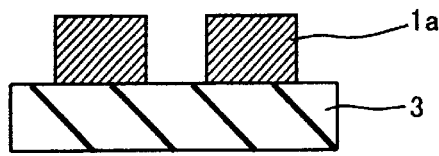

First, a semiconductor substrate (or semiconductor wafer) 3 is coated with a first resist 1, as shown in FIG. 2(a). This resist evolves an acid upon adequate heating. The coating thickness is about 0.7–1.0 μm, for example. Coating is carried out by spin coating, which is followed by pre-baking (or heat treatment at 70–110° C. for about 1 minute) to evaporate solvent from the first resist 1.

Then, the first resist 1 is exposed to light through a mask with a pattern as shown in FIGS. 1(*a*) to 1(*c*) so as to form a first resist pattern. The light source for exposure should be selected from g-line, i-line, deep UV, KrF excimer laser, ArF excimer laser, electron beam (EB), X-ray and the like, according to the wavelength to which the first resist 1 is sensitive.

The first resist 1 may be one which evolves an acid therein upon adequate heating. It may be either of positive type or negative type. One example is a positive resist composed of novolac resin and naphthoquinonediazide sensitizer. Another example is a chemically amplified resist which evolves an acid. Any other resists which evolve an acid upon heating are acceptable.

After exposure, the first resist 1 undergoes optional PEB (post-exposure baking) (for example, at 50–130° C.) for improvement in resolution. This step is followed by development with an alkaline aqueous solution (about 0.05–3.0 wt %) of TMAH (tetramethylammonium hydroxide). Thus there is obtained the first resist pattern la as shown in FIG. 2(*b*) (The first step).

Development may be followed by optional post-development baking (for example, at 60–120° C. for about 60 seconds). An adequate temperature should be established according to the kind of the first resist used so that the heat treatment favorably affects the subsequent mixing reaction.

The procedure up to the stage mentioned above is the same as that to form the resist pattern by the ordinary resist method except that it employs the first resist 1 that evolves an acid.

The first resist pattern la formed on the semiconductor substrate 3 is coated with a chemical solution 2 as shown in FIG. 2(*c*). This chemical solution 2 contains a crosslinking agent which brings about crosslinking reactions in the presence of an acid, a swelling promoter, and a solvent which does not dissolve the first resist pattern 1*a*. Coating method to coat the chemical solution 2 onto the first resist pattern 1*a* is not limitative as far as the first resist pattern 1*a* can be coated uniformly. Coating may be accomplished by spray coating, spin coating (as in resist application), dropping (as in resist development), or dipping (as in wet etching) (The second step).

The chemical solution 2 is kept in contact with the first resist pattern 1*a* for a prescribed period of time, as shown in FIG. 2(*d*), so that the crosslinking agent and the swelling promoter in it permeate into the surface layer of the first resist pattern 1*a*, thereby forming a swollen surface layer 4 on the surface of the first resist pattern 1*a* (The third step).

The chemical solution 2 is washed away by water for example as shown in FIG. 2(*e*) (The fourth step).

The semiconductor substrate 3 is entirely heated at 85–150° C. for 60–120 seconds for application of thermal energy, for example, so that the crosslinking reaction takes place in the swollen surface layer 4 and the crosslinked film 4*a* is formed, as shown in FIG. 2(*f*). This heating method is referred to as "mixing baking" (or MB for short) hereinafter.

As the result of this heating, the crosslinked film 4 covers the surface of the first resist pattern 1*a*. In this way there is formed the fine second resist pattern 2*a* (The fifth step).

The application of thermal energy to the semiconductor substrate 3 and the first resist pattern 1*a* may be accomplished by placing the wafer one by one on a temperature-controlled hot plate or by placing a plurality of wafers in a temperature-controlled baking furnace.

The thickness of the crosslinked film should be controlled based on temperature and time subjected to application of thermal energy provided by adjusting the time and temperature for the crosslinking agent and swelling promoter to permeate into the first resist pattern during dipping or the like and also adjusting the temperature and time for baking.

The second resist pattern 1*b* (or the finely separated resist pattern) formed as mentioned above is used as a mask for the subsequent etching to make fine spaces or fine holes in the underlying layer. In this way the desired semiconductor device is fabricated. (The sixth step).

In the embodiment mentioned above, the first resist pattern 1*a* forms a crosslinked film on its surface upon contact with the chemical solution 2. This crosslinked film reduces the width of pattern separation and the hole diameter. In addition, the crosslinked film has good etching resistance and hence permits finer patterns than before to be formed by etching.

For good contact between the first resist pattern 1*a* and the chemical solution 2, dropping or dipping is desirable. Spin coating may not permit the chemical solution 2 to cover completely the first resist pattern 1*a* which might have large steps.

The foregoing steps yield the resist pattern 2*a*, with a reduced hole diameter in hole patterns, with a reduced separation width in line patterns, or with an increased area in island patterns.

The following examples are given to explain in more detail the method for forming fine resist patterns and the method for producing semiconductor devices.

EXAMPLE 1

The method in this example starts with forming the first resist pattern 1*a* (a hole pattern 0.20 μm in diameter) from a chemically amplified positive resist exposed to KrF excimer laser.

The semiconductor substrate 3, on which the first resist pattern 1*a* has been formed, is dipped in a chemical solution 2 (an aqueous solution of ethyleneurea and N-methylpyrrolidone) for 120 seconds to be permeated and swollen. The semiconductor substrate 3 is then pulled up from the solution and dried. The first resist pattern 1*a*, which has swollen with the chemical solution 2, is heated at 120° C. for 120 seconds in a temperature-controlled baking furnace.

Thus, there is formed the crosslinked film 4, which narrows the opening diameter of the second resist pattern 1*b* to 0.17 μm. Using the second resist pattern 2*a* as a mask, etching is carried out to form a hole with a diameter of 0.17 μm.

The dipping time and the baking temperature should be properly controlled to form the top layer or cover layer of desired thickness.

If dipping is replaced by spin coating or dropping, it is necessary to adequately control the amount of solution delivery, the time of solution contact, the rotational speed, and the baking temperature.

The above-mentioned method for manufacturing the fine resist pattern and semiconductor device was carried out using the apparatus explained below.

The step shown in FIG. 2(*c*), in which the first resist pattern 1*a* on the semiconductor substrate 3 is treated with the chemical solution 2, employs any of the following three apparatus.

(i) An ordinary resist coating unit is used to supply the chemical solution 2 for spin coating. This apparatus permits the chemical solution to be discharged from the resist delivery nozzle (or resist pre-wetting nozzle) by pumping or under pressure.

(ii) An ordinary resist developing unit is used to supply the chemical solution 2 in the same way as in development. This apparatus permits the chemical solution to be discharged from the nozzle for developer or for pure water.

(iii) An ordinary wetting unit is used to supply the chemical solution 2 for dipping. This apparatus has a large tank to hold the chemical solution 2, in which the substrate 3, together with the first resist pattern 1a, is dipped. The chemical solution in the tank should be kept at an adequate temperature and renewed periodically to avoid degradation. Dipping permits a plurality of semiconductor substrates (or wafers) to be treated simultaneously although the condition of the chemical solution is loose in control.

Figure 2C:
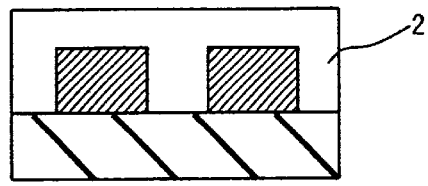
Figure 2D:
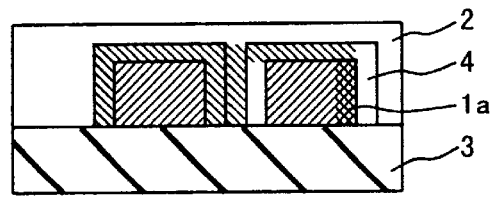
Figure 2E:
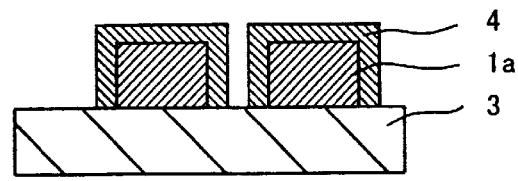
Figure 2F:
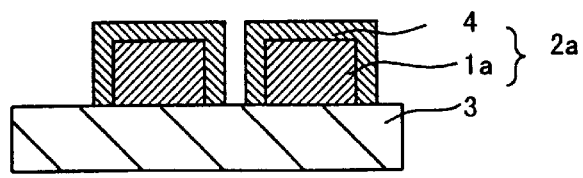

The step shown in FIG. 2(f), in which the substrate 3 having the first resist pattern 1a and the swollen surface layer 4 are heated for crosslinking, employs any of the following two apparatus to supply heat.

(a) A temperature-controlled oven is used to supply heat for crosslinking. Heating in this manner permits a plurality of wafers to be treated simultaneously although it is somewhat loose in control over heating temperature and time.

(b) A baking unit of the ordinary resist coating and developing apparatus is used to supply heat for crosslinking.

EXAMPLE 2

This example demonstrates the method and apparatus for forming the finely separated resist pattern according to the first embodiment of the present invention.

The first resist pattern 1a is formed on the semiconductor substrate 3. The substrate 3 is supplied with the chemical solution 2 from the nozzle of the developing unit Cleantruck manufactured by Tokyo Electron, for example. The substrate 3 in the developing unit is allowed to hold the chemical solution thereon for 120 seconds. The chemical solution is removed by spinning. After drying, the substrate is heated in the baking unit at 120° C. for 120 seconds. Thus there is obtained the crosslinked film 4a.

The chemical solution 2 used in the above-mentioned method is explained in the following.

The chemical solution 2 comprises a solvent, a crosslinking agent (which performs crosslinking in the presence of an acid) and a swelling promoter. Upon contact with the resist film, it causes the crosslinking agent and swelling promoter to permeate into the resist film.

Examples of the crosslinking agent include melamine derivatives, urea derivatives, benzoguanamine, and glycoluril. They may be used alone or in combination with one another as a main component of the crosslinking agent.

Water-soluble crosslinking agents include urea derivertives such as urea, alkoxymethyleneurea, N-alkoxymethyleneurea, ethyleneurea, ethyleneureacarboxylic acid; melamine derivertives such as melamine, alkoxymethylenemelamine; amine derivertives such as benzoguanamine; and glycoluril (whose structural formulas are shown in FIG. 3). Any other crosslinking agents may be used so long as they bring about crosslinking in the presence of an acid.

The solvent of the chemical solution 2 is water or a water-based solvent. It should not dissolve the first resist pattern 1a but should be able to dissolve completely water-soluble materials. It is not specifically restricted so long as it meets these requirements.

Examples of the solvent include water (pure water), an alcohol-based solvent (e.g. a mixture of water and IPA), or a water-soluble organic solvent (e.g. N-methylpyrrolidone).

Examples of the water-soluble solvent include an alcohol such as ethanol, methanol, isopropyl alcohol; γ-butyrolactone; and acetone. Their amount should be properly established so that the resulting mixed solvent does not dissolve the first resist pattern.

Examples of the swelling promoter include the following: cellosolve type solvents such as methyl cellosolve, ethyl cellosolve, methyl cellosolve acetate, and ethyl cellosolve acetate; ester type solvents such as diethyl oxalate, ethyl pyruvate, ethyl-2-hydroxybutyrate, ethyl acetoacetate, butyl acetate, amyl acetate, ethyl butyrate, butyl butyrate, methyl lactate, ethyl lactate, and methyl 3-methoxypropionate; propyleneglycol type solvents such as propyleneglycol monomethyl ether, propyleneglycol monoethyl ether, propyleneglycol monobutyl ether, propyleneglycol monoethyl ether acetate, propyleneglycol monoethyl ether acetate, propyleneglycol monobutyl ether acetate, and dipropyleneglycol dimethyl ether; ketone type solvents such as 2-hexanone, cyclohexanone, methyl amyl ketone, and 2-heptanone; dimethylsulfoxide; and N-methylpyrrolidone. They may be used alone or in combination with one another as a main componet of the swelling promoter.

Those solvents mentioned above are resist solvents; therefore, they should be used after adequate dilution with water so that they permeate into and swell the resist pattern without dissolving it.

EXAMPLE 3

This example demonstrates the chemical solution 2 which was prepared as follows. In a 1-liter measuring flask were placed 100 g of methoxymethylolmelamine ("cymel 370" from Mitsui Cyanamide), 780 g of pure water, and 40 g of IPA. They were mixed with stirring at room temperature for 6 hours. Thus there was obtained around 10 wt % aqueous solution of methylolmelamine. This solution was incorporated with N-methylpyrrolidone as a swelling promoter.

EXAMPLE 4

This example demonstrates the chemical solution 2 which was prepared as follows. In a 1-liter measuring flask were placed 100 g of (N-methoxymethyl)methoxyethyleneurea, 100 g of (N-methoxyethyl)hydroxyethyleneurea, 100 g of N-methoxymethylurea, 860 g of pure water, and 40 g of IPA. They were mixed with stirring at room temperature for 6 hours. Thus there was obtained around 10 wt % aqueous solution of ethyleneurea. This solution was incorporated with N-methylpyrrolidone as a swelling promoter.

The foregoing is a detailed description of the method for forming the finely separated resist pattern 1b on the semiconductor substrate 3. This method may also be applied to form a finely separated resist pattern on an insulating layer such as a silicon oxide film or a conducting layer such as polysilicon layer in manufacturing of semiconductor devices. In other words, the method may be applied to any substrates (underlying materials). They are collectively referred to as semiconductor substrates herein.

According to the present invention, the finely separated resist pattern formed as mentioned above is used as a mask for etching on semiconductor substrates including various types of thin films to make fine spaces and fine holes in manufacturing of semiconductor devices.

Second Embodiment

A second embodiment is designed to repeat several times the step of forming the crosslinked film which was explained in the first embodiment.

The procedure in the second embodiment starts with forming the crosslinked film as shown in FIG. 2(f). The resulting fine resist pattern 1b undergoes the same steps as shown in FIG. 2(c) forward as follows: the second step, shown in FIG. 2(c), to treat the first resist pattern 1a with the chemical solution 2; the third step, shown in FIG. 2(d), to permit the surface layer of the first resist pattern 1a to permeate the crosslinking agent and swelling promoter from the chemical solution 2; the fourth step, shown in FIG. 2(e), to remove the chemical solution 2; and the fifth step, shown in FIG. 2(f), to heat the swollen surface layer, thereby forming the crosslinked film.

The cycle of the above-mentioned steps may be repeated as many times as necessary until the crosslinked film has a desired thickness for the fine pattern.

EXAMPLE 5

This example demonstrates the second embodiment. The method in this example starts with forming the first resist pattern 1a (a hole pattern 0.20 μm in diameter) from a chemically amplified positive resist exposed to KrF excimer laser.

The semiconductor substrate 3, on which the first resist pattern 1a has been formed, is dipped in a chemical solution 2 (an aqueous solution of urea and N-methylpyrrolidone) for 120 seconds so as to be permeated and swollen. The substrate thus obtained is pulled up and dried. The first resist pattern 1a, which has swollen with the chemical solution 2, is heated at 120° C. for 120 seconds in a temperature-controlled baking furnace. Thus, there is formed the crosslinked film 4a, which narrows the opening diameter of the second resist pattern 1b to 0.17 μm.

The second resist pattern 1b is dipped once again in the chemical solution, followed by heating (baking). These methods are repeated until the resist pattern finally obtained has an opening diameter of 0.14 μm.

The second embodiment can be carried out by using the same method, apparatus, and chemical solution as used in the first embodiment. Therefore, their explanation is omitted.

Using the thus obtained finely separated resist pattern as a mask, etching is carried out to manufacture semiconductor devices in the same way as in the first embodiment.

The effect and advantage of the present invention as described above may be summarizes as follows.

The present invention makes it possible to form a fine pattern which exceeds the limit placed by the wavelength of light for exposure. The fine pattern has a smaller hole diameter and a narrower space which could not be achieved by the conventional technology. Therefore, the present invention permits manufacturing of semiconductor devices having narrow separated spaces and small hole diameters. obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-273125, filed on Sep. 27, 1999, including specification, claims, drawings and summary, on which the Convention priority of the present application is based, are incorporated herein by reference in its entirety.

What is claimed is:

1. A method of manufacturing a semiconductor device, said method comprising:

a first step of forming on a semiconductor substrate a first resist pattern which is capable of evolving an acid;

a second step of treating said first resist pattern with a chemical solution containing a crosslinking agent and a swelling promoter, said crosslinking agent bringing about crosslinking in the presence of an acid in the surface layer of said first resist pattern;

a third step of causing said crosslinking agent and swelling promoter in said chemical solution to permeate into the surface layer of said first resist pattern, thereby swelling the surface layer;

a fourth step of removing said chemical solution from the surface of said first resist pattern;

a fifth step of causing said first resist pattern to evolve an acid from said first resist pattern, which forms a crosslinked film in the swollen surface layer of said first resist pattern, thereby forming a second resist pattern; and a sixth step of etching said semiconductor substrate through said second resist pattern as a mask.

2. The method of manufacturing a semiconductor device according to claim 1, wherein the sixth step is preceded by one or more repetitions of the second to fifth steps.

3. The method of manufacturing semiconductor device according to claim 1, wherein the treating of the surface of said first resist pattern with said chemical solution in said second step is accomplished by coating said first resist pattern with said chemical solution, by dropping said chemical solution on said first resist pattern, or by dipping said semiconductor substrate having said first resist pattern in said chemical solution.

4. The method of manufacturing a semiconductor device according to claim 1, wherein said fifth step includes applying thermal energy to said first resist pattern to evolve an acid.

* * * * *

UNITED STATES PATENT AND TRADEMARK OFFICE
CERTIFICATE OF CORRECTION

PATENT NO. : 6,376,157 B1
DATED : April 23, 2002
INVENTOR(S) : Mikihiro Tanaka et al.

It is certified that error appears in the above-identified patent and that said Letters Patent is hereby corrected as shown below:

<u>Title page,</u>
Item [75], Inventors, change the inventor text from "Mikihiro Tanaka; Takeo Ishibashi, both of Tokyo (JP)" to -- Mikihiro Tanaka, Hyogo (JP); Takeo Ishibashi, Tokyo (JP) --

Signed and Sealed this

Tenth Day of June, 2003

JAMES E. ROGAN
*Director of the United States Patent and Trademark Office*